United States Patent [19]
Hatakeyama et al.

[11] Patent Number: 5,828,613
[45] Date of Patent: Oct. 27, 1998

[54] RANDOM-ACCESS MEMORY

[75] Inventors: Atsushi Hatakeyama; Shusaku Yamaguchi, both of Kawasaki, Japan

[73] Assignee: Fujitsu Limited, Kanagawa, Japan

[21] Appl. No.: 932,605

[22] Filed: Sep. 17, 1997

[30] Foreign Application Priority Data

Dec. 27, 1996 [JP] Japan .................................. 8-351276

[51] Int. Cl.⁶ .................................................. G11C 7/00
[52] U.S. Cl. ..................... 365/205; 365/202; 365/230.06
[58] Field of Search .............................. 365/230.01, 205, 365/202, 230.6, 190, 208, 174

[56] References Cited

U.S. PATENT DOCUMENTS

| | | | |
|---|---|---|---|
| 4,821,232 | 4/1989 | Nakano et al. | 365/202 |
| 5,132,932 | 7/1992 | Tobita | 365/222 |
| 5,313,426 | 5/1994 | Sakuma et al. | 365/205 |
| 5,412,605 | 5/1995 | Ooishi | 365/203 |
| 5,495,443 | 2/1996 | Koike | 365/189.09 |
| 5,528,542 | 6/1996 | Okamura | 365/205 |
| 5,555,523 | 9/1996 | Haga et al. | 365/203 |
| 5,594,695 | 1/1997 | Yim et al. | 365/205 |
| 5,619,465 | 4/1997 | Normura et al. | 365/206 |
| 5,666,319 | 9/1997 | Okamura | 365/205 |
| 5,699,316 | 12/1997 | Matsui et al. | 365/230.05 |
| 5,702,819 | 12/1997 | Gotoh | 365/203 |

*Primary Examiner*—David C. Nelms
*Assistant Examiner*—Tuan T. Nguyen
*Attorney, Agent, or Firm*—Nikaido Marmelstein Murray & Oram

[57] ABSTRACT

There are provided a sense amplifier driving circuit 900 applying a potential VCC/2 to wirings PSA and NSA when a block selecting signal BS0 is at a "L", and applying a potential VCC to the wiring PSA via a pMOS transistor 91 and applying a grounding potential to the wiring NSA via an nMOS transistor 94 when the block selecting signal BS0 is at a "H", and a LDB reset circuit 901A connected between the wiring PSA and a local data bus line pair LDB0 and *LDB0 and including pMOS transistors 95A and 96A which are closed/opened in correspondence to the open/closed state of a column gate 700.

9 Claims, 10 Drawing Sheets

RANDOM-ACCESS MEMORY

BACKGROUND OF THE INVENTION

1. Field of the Invention

The present invention relates to a RAM (Random-Access Memory).

2. Description of the Related Art

As the operation of MPUs becomes faster, the need for RAM with faster access is increasing, and on the other hand, the ever increasing storage capacity of RAM requires a reduction in the number of circuit elements.

Figure 7:
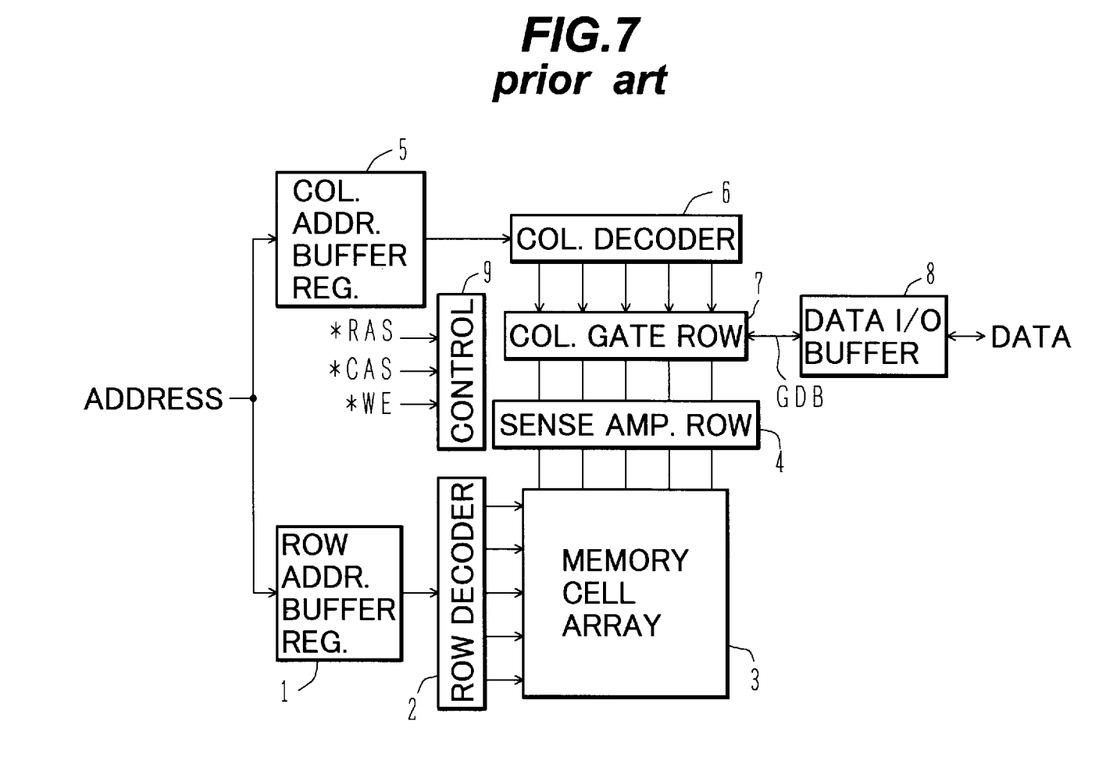
FIG. 7 is a block diagram showing a schematic structure of a DRAM in the prior art.

FIG. 7 shows a schematic structure of a DRAM in the prior art.

A row address held in a row address buffer register 1 is decoded by a row decoder 2, thereby one of word lines is selected, and the data in a memory cell row within a memory cell array 3 connected to this word line are read out as minute voltage to bit lines to be amplified at a sense amplifier row 4.

A column address held in a column address register 5 is decoded at a column decoder 6, thereby a column gate within a column gate row 7 is selectively opened, and the data on the corresponding bit line runs through this column gate to be read out to a global data bus line GDB.

In the case of a read, the data is extracted to the outside through a data I/O buffer circuit 8, whereas in the case of a write, an input data runs from the data I/O buffer circuit 8 through the global data bus line GDB and the selected column gate to the selected bit line within the memory cell array 3 so that it is written in the selected memory cell.

The components 1 to 8 are controlled by a control circuit 9. A row address strobe signal *RAS, a column address strobe signal *CAS and a write enable signal *WE are provided to the control circuit 9 from the outside.

Figure 8:
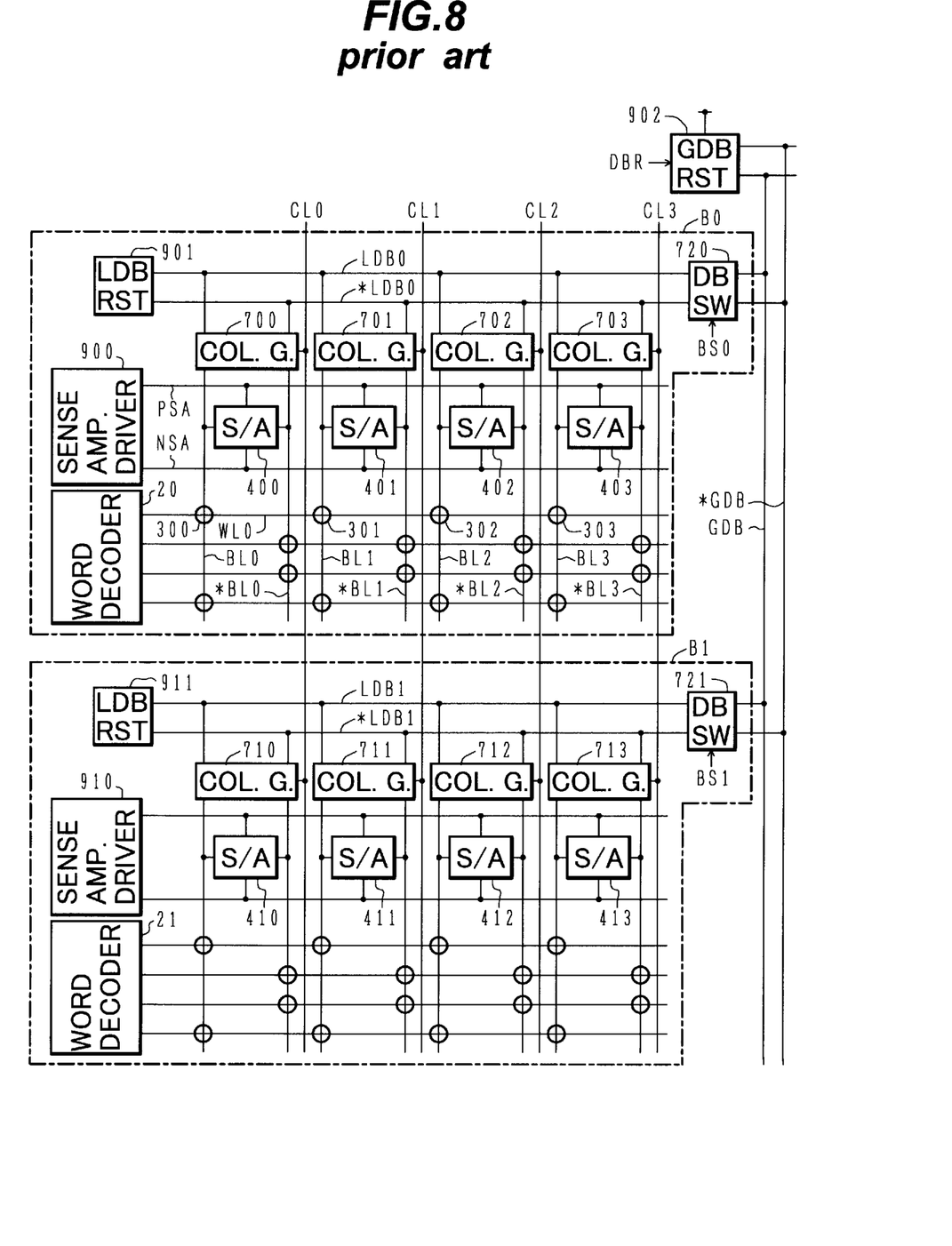
FIG. 8 is a block diagram showing a memory cell array and its peripheral circuit in the prior art.

In order to achieve faster access by reducing the length of the bit lines, the memory cell array 3 is constituted of a plurality of blocks and FIG. 8 shows a structure in which, for simplification, the number of blocks is 2 and the number of memory cells in each block is 4×4=16. In FIG. 8, the circles indicate memory cells.

In a block B0, a word decoder 20 is provided with a decoder and a word driving circuit at its output stage, and it constitutes part of the row decoder 2 of FIG. 7. Sense amplifiers 400 to 403 constitute part of the sense amplifier row 4, column gates 700 to 703 and a data bus switch 720 constitutes part of the column gate row 7 and a sense amplifier driving circuit 900 and a LDB (local data bus) reset circuit 901 constitute part of the control circuit 9.

A block B1 has a structure identical to that of the block B0, with a word decoder 21 constituting part of the row decoder 2, sense amplifiers 410 to 413 constituting part of the sense amplifier row 4, column gates 710 to 713 and a data bus switch 721 constituting part of the column gate row 7 and a sense amplifier driving circuit 910 and a LDB reset circuit 911 constituting part of the control circuit 9.

A GDB (global data bus) reset circuit 902 provided outside the blocks B0 and B1 constitutes part of the control circuit 9. Column selecting lines CL0 to CL3 are connected to control inputs at the column gates in their respective columns, with one end of each of them connected to an output of the column decoder 6.

Figure 9:
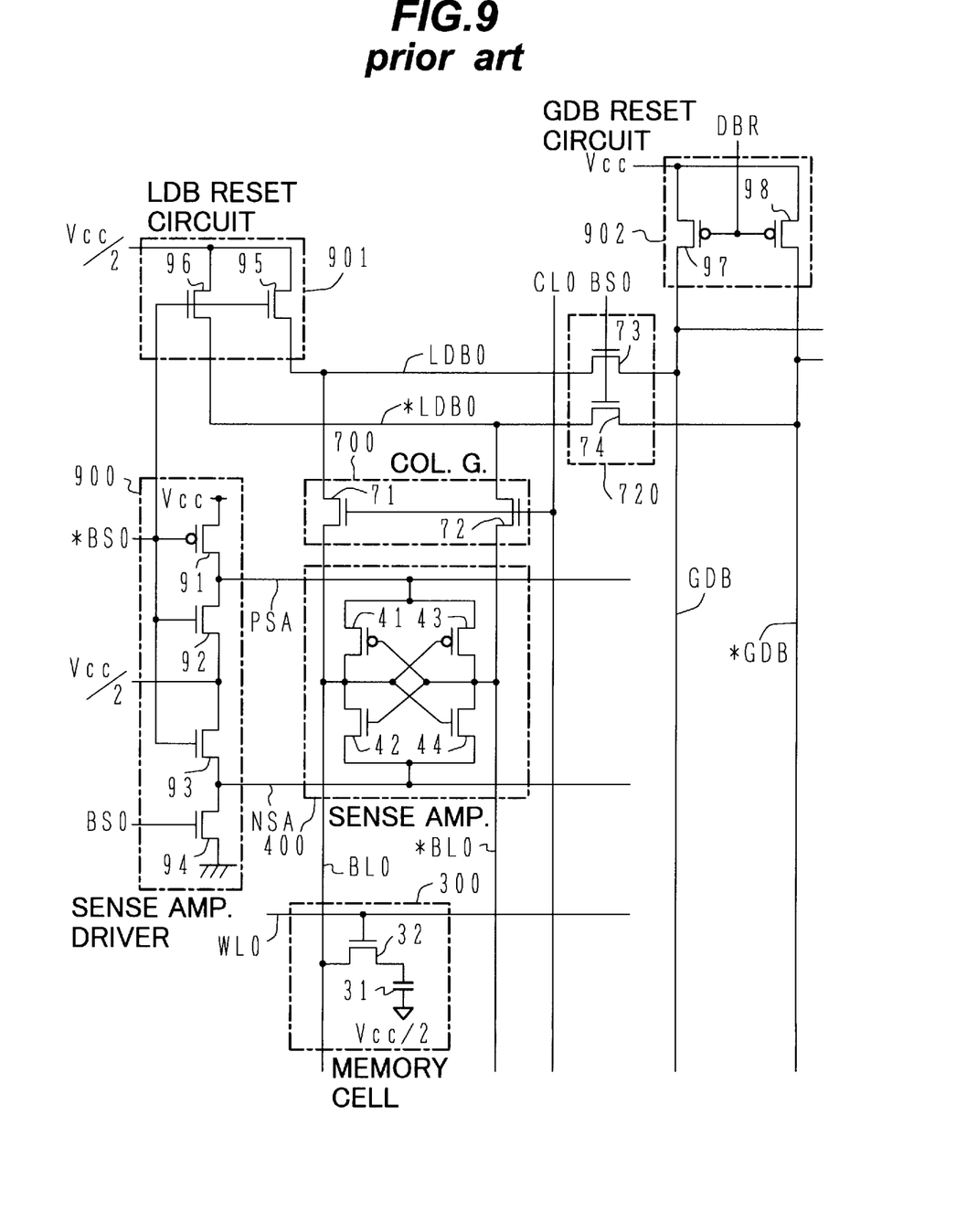
FIG. 9 is a circuit diagram showing a structural example of a portion of FIG. 8.

FIG. 9 is a circuit diagram showing a structural example of a portion of FIG. 8. In each figures, "*" added at the head of a reference characters indicates that the signal is complementary to the signal with the same reference characters without "*", and when one of the two complementary signals is at a "L" (low voltage level), the other is at a "H" (high voltage level).

First, a standby state is described.

In FIG. 9, a block selecting signals BS0 and *BS0 are at a "L" and a "H" respectively, thereby in the sense amplifier driving circuit 900, a pMOS transistor 91 and an nMOS transistor 94 are off and NMOS transistors 92 and 93 are on, in the LDB reset circuit 901, nMOS transistors 95 and 96 are on and in the data bus switch 720, nMOS transistors 73 and 74 are off. In this state, with wirings PSA and NSA at an intermediate potential VCC/2, the sense amplifier 400 is inactive and a local data bus line pair LDB0 and *LDB0 are being precharged to the intermediate potential VCC/2.

In addition, a data bus reset signal DBR is at a "L", thereby a global data bus line pair GDB and *GDB are being precharged to a power-supply potential VCC. The column selecting line CL0 is at a "L", thereby the nMOS transistors 71 and 72 are off. A word line WL0 is at a "L", thereby an nMOS transistor 32 is off.

In FIG. 8, the column selecting lines CL1 to CL3, too, are set to a "L" and the column gates connected to them are all closed. The block B1 is in the same state as the block B0.

Figure 10:
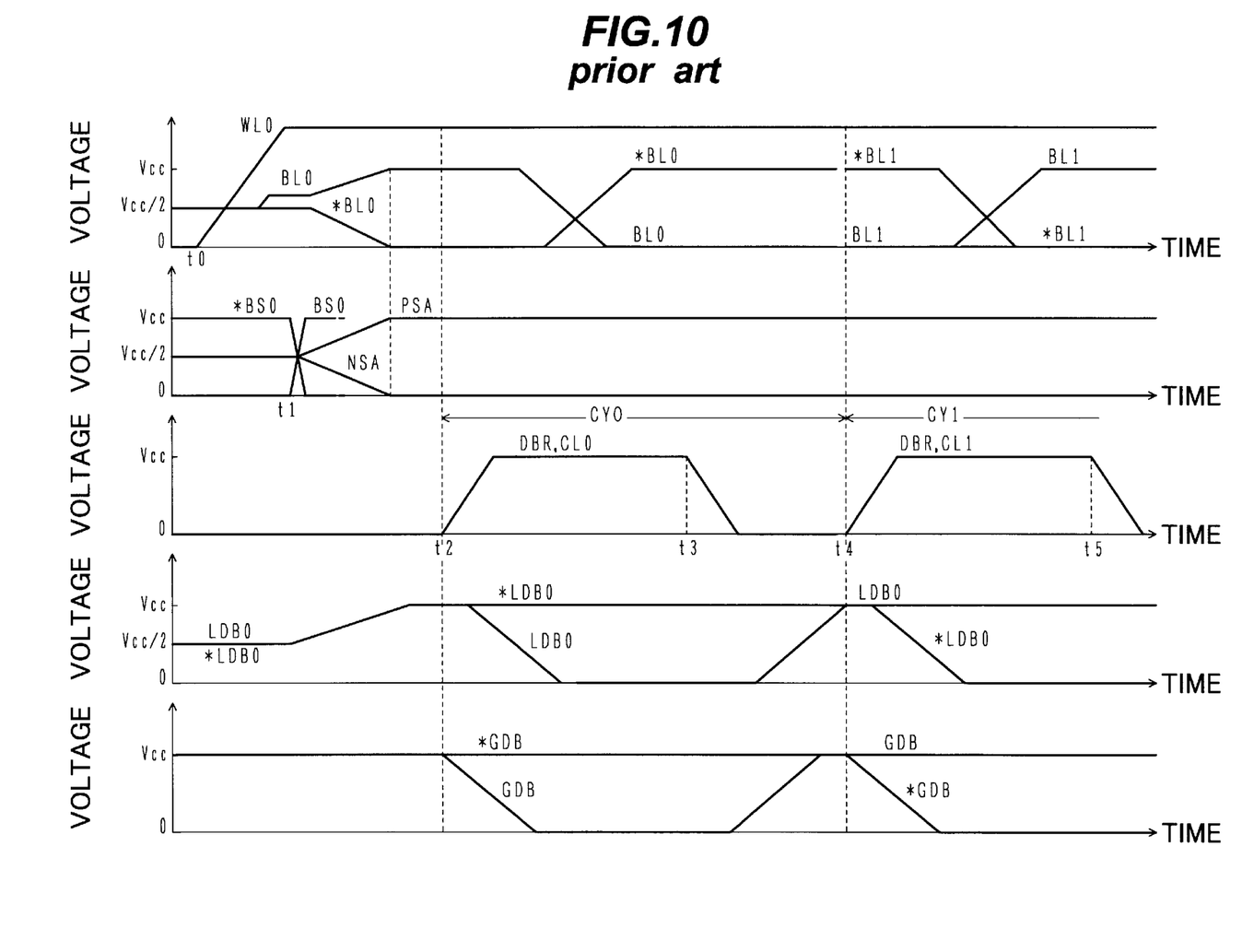
FIG. 10 is a waveform diagram showing an operation performed by the circuit shown in FIGS. 8 and 9.

Next, an explanation is given of a case in which, with a "H" and a "L" stored in memory cells 300 and 301 respectively, a "L" and a "H" data are sequentially written in the memory cells 300 and 301 respectively in burst mode. Hereafter, reference numbers t0 to t5 in parentheses indicate time points used in FIG. 10, and operations resulting from changes occurring from individual time points are described.

The word line WL0 and the block B0 are selected in the following manner.

(t0) The word line WL0 is selected, and the data stored in the memory cell 300 are read out to the bit line BL0.

(t1) The block selecting signals BS0 and *BS0 transits respectively to a "H" and a "L", thereby the nMOS transistors 92 and 93 are turned off, the pMOS transistor 91 and the nMOS transistor 94 are turned on, the nMOS transistors 95 and 96 are turned off and nMOS transistors 73 and 74 are turned on.

This causes the wirings PSA and NSA to transit to a "H" and a "L" respectively, to activate the sense amplifier 400. Also, the local data bus line pair LDB0 and *LDB0 are precharged to the power-supply potential VCC.

The operation to write a "L" into the memory cell 300 where a "H" is stored is performed in the following manner.

(t2) In FIG. 9, the data bus reset signal DBR and the column selecting line CL0 transit to "H", thereby pMOS transistors 97 and 98 are turned off and the nMOS transistors 71 and 72 are turned on. Coincident with this, write data is provided from the data I/O buffer circuit 8 shown in FIG. 7 to make the global data bus line GDB transit to a "L" and this is transmitted to the local data bus line LDB0 and the bit line BL0.

Thereby the bit lines BL0 and *BL0 transit to a "L" and a "H" respectively, and a "L" on the bit line BL0 transmits through the nMOS transistor 32 to be written in a capacitor 31.

(t3) As a preparation to a next access, the data bus reset signal DBR and the column selecting line CL0 transit to "L", thereby the pMOS transistors 97 and 98 are turned on and the nMOS transistors 71 and 72 are turned off.

This causes the global data bus line pair GDB and *GDB to be precharged to the power-supply potential VCC. Also, the local data bus line pair LDB0 and *LDB0 are precharged to the power-supply potential VCC.

The operation to write a "H" in the memory cell 301 where "L" is stored is performed in the following manner.

(t4) In FIG. 8, the data bus reset signal DBR and the column selecting line CL1 transit to a "H", thereby the GDB reset circuit 902 is turned off and the column gate 701 is turned on. Coincident with this, write data is provided from the data I/O buffer circuit 8 in FIG. 7, the global data bus line *GDB transits to a "L" and this is transmitted to the local data bus line *LDB0 and the bit line *BL1. In addition, "H" at the local data bus line LDB0 is transmitted to the bit line BL1.

This causes the bit lines BL1 and *BL1 transit to a "H" and a "L" respectively and a "H" on the bit line BL1 is written in the memory cell 301.

(t5) The data bus reset signal DBR and the column selecting line CL1 transit to "L", the GDB reset circuit 902 is turned on and the column gate 701 is turned off.

This causes the global data bus line pair GDB and *GDB and the local data bus line pair LDB0 and *LDB0 to be precharged to the power-supply potential VCC.

A write cycle CY1 with which a write to the memory cell 301 is performed is the same as a write cycle CY0 with which a write to the memory cell 300 is performed.

Although a read cycle may be set shorter than a write cycle, since those cycles are set to be the same, it is necessary to reduce the time required for a write in order to achieve faster access.

As described above, between the time t3 and t4 in FIG. 10, the global data bus line pair GDB and *GDB and the local data bus line pair LDB0 and *LDB0 are precharged by the GDB reset circuit 902. Since the time constant, which is the product of the resistance of a relatively long wiring and the floating capacity thereof, is relatively large, the time required for a reset performed by the GDB reset circuit 902 is long, preventing faster column access. If the number of circuit elements is increased to reduce this length of time, a new problem will arise in that the area occupied by them becomes large.

In addition, from another point of view away from faster access, since both the LDB reset circuit 901 and the GDB reset circuit 902 are required to be provided for the precharge of the potentials VCC/2 and VCC, resulting in a complicated structure.

SUMMARY OF THE INVENTION

Accordingly, an object of the present invention is to provide a random-access memory with which a length of time required for column access can be reduced without having to increase the number of circuit elements or with a small increase in the number of circuit elements.

Another object of the present invention is to provide a random-access memory with which a simplification in the structure can be achieved by reducing the number of circuit elements.

According to an aspect of the present invention, there is provided a semiconductor device including a random-access memory, the random-access memory comprising: a sense amplifier driving circuit, for providing an intermediate potential to a first wiring and a second wiring in response to a selecting signal being inactive, and for providing a first potential higher than the intermediate potential via a first switching element to the first wiring and a second potential lower than the intermediate potential via a second switching element to the second wiring in response to a selecting signal being active; a sense amplifier, powered by a voltage between the first wiring and the second wiring, for amplifying a voltages between a bit line pair; a column gate, having a switching element connected between the bit line pair and a first data bus line pair, to be selectively opened/closed corresponding to a given memory address; and a first bus reset circuit, connected between one of the first wiring and the second wiring and the first data bus line pair, having a switching element to be closed/opened in correspondence to an open/closed state of the column gate.

The present invention operates as follows.

While the column gate is closed, the first data bus line pair is precharged to an intermediate potential with the selecting signal being inactive. Then, when the selecting signal becomes active, the first data bus line pair is precharged to either a first potential or a second potential. Next, when the column gate opens, the switching element of the first bus reset circuit is turned off, allowing a data to read out from a bit line pair to the first data bus line pair or a data to write from the first data bus line to the bit line pair.

After a data readout or a data write, in order to prepare for the next access, the column gate is closed, the switching element of the first bus reset circuit is turned on and, the first data bus line pair is precharged to either the first potential or the second potential in a manner similar to that described above.

Since the first data bus line pair is precharged to the intermediate potential, even if the column gate opens with the selecting signal being inactive, no current is allowed to flow between the first data bus line pair and the bit line pair.

Although, in the prior art, the circuit for precharging the first data bus line pair to the intermediate potential and the circuit for precharging the first data bus line pair to either the first potential or the second potential must be provided independently, since both precharges are performed with one bus reset circuit, i.e., the first bus reset circuit according to the present invention, an advantage is achieved in that the structure is simplified.

In the 1st mode of the present invention, the random-access memory comprises a plurality of blocks each includes the sense amplifier driving circuit, the sense amplifier, the column gate and the first bus reset circuit, and wherein the selecting signal is applied to selecting one of the plurality of blocks, the random-access memory further comprises: a data bus switching circuit, connected between a second data bus line pair provided outside the plurality of blocks and the first data bus line pair within each of the plurality of blocks, to be opened/closed in correspondence to the selecting signal being active/inactive.

With the 1st mode, since the sense amplifier is provided for each block and the bit line pair is shortened as it is divided by the blocks, faster access becomes possible.

In the 2nd mode of the present invention, it further comprises: a second bus reset circuit connected between a conductor and the second data bus line pair, having a switching element to be closed/opened in correspondence to the open/closed state of the column gate, the conductor being supplied with either the first potential or the second potential corresponding to the one of the first wiring and the second wiring.

With the 2nd mode, since the first data bus line pair is precharged to either the first potential or the second potential by the first bus reset circuit and, at the same time, the second data bus line pair is precharged to either the first potential or the second potential in a similar manner by a second bus reset circuit, the length of time required for precharging is reduced compared to a structure in which the two data bus line pairs are precharged by the second bus reset circuit only, resulting in a reduced length of time required for column access, thereby achieving faster column access.

In the 3rd mode of the present invention, both of a control input of the switching element of the first bus reset circuit and a control input of the switching element of the second bus reset circuit receive a common control signal.

With the 3rd mode, an advantage is achieved in that the structure is further simplified.

In the 4th mode of the present invention, the first bus reset circuit comprises: a first pMOS transistor, connected between the first wiring and one of the first data bus line pair, having a gate electrode adapted to receive a data bus reset signal; and a second pMOS transistor, connected between the first wiring and the other of the first data bus line pair, having a gate electrode connected to the gate electrode of the first pMOS transistor; and the second bus reset circuit comprises: a third pMOS transistor, connected between the conductor supplied with the first potential and one of the second data bus line pair, having a gate electrode adapted to receive the data bus reset signal; a fourth pMOS transistor, connected between the conductor and the other of the second data bus line pair, having a gate electrode connected to the gate electrode of the third pMOS transistor.

In the 5th mode of the present invention, the first bus reset circuit comprises: a first nMOS transistor, connected between the second wiring and one of the first data bus line pair, having a gate electrode adapted to receive a data bus reset signal; and a second NMOS transistor, connected between the second wiring and the other of the first data bus line pair, having a gate electrode connected to the gate electrode of the first nMOS transistor; and the second bus reset circuit comprises: a third nMOS transistor, connected between the conductor supplied with the second potential and one of the second data bus line pair, having a gate electrode adapted to receive the data bus reset signal; a fourth nMOS transistor, connected between the conductor and the other of the second data bus line pair, having a gate electrode connected to the gate electrode of the third nMOS transistor.

In the 6th mode of the present invention, the random-access memory is a DRAM.

According to another aspect of the present invention, there is provided a random-access memory comprising: a sense amplifier driving circuit having an output node, for providing a first potential or a second potential being different from the first potential at the output node in response to a selecting signal; a bus line operatively connected with a bit line, for transmitting data from the bit line; and a bus reset circuit, connected between the output node and the bus line, for providing the first potential or the second potential in a reset period.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
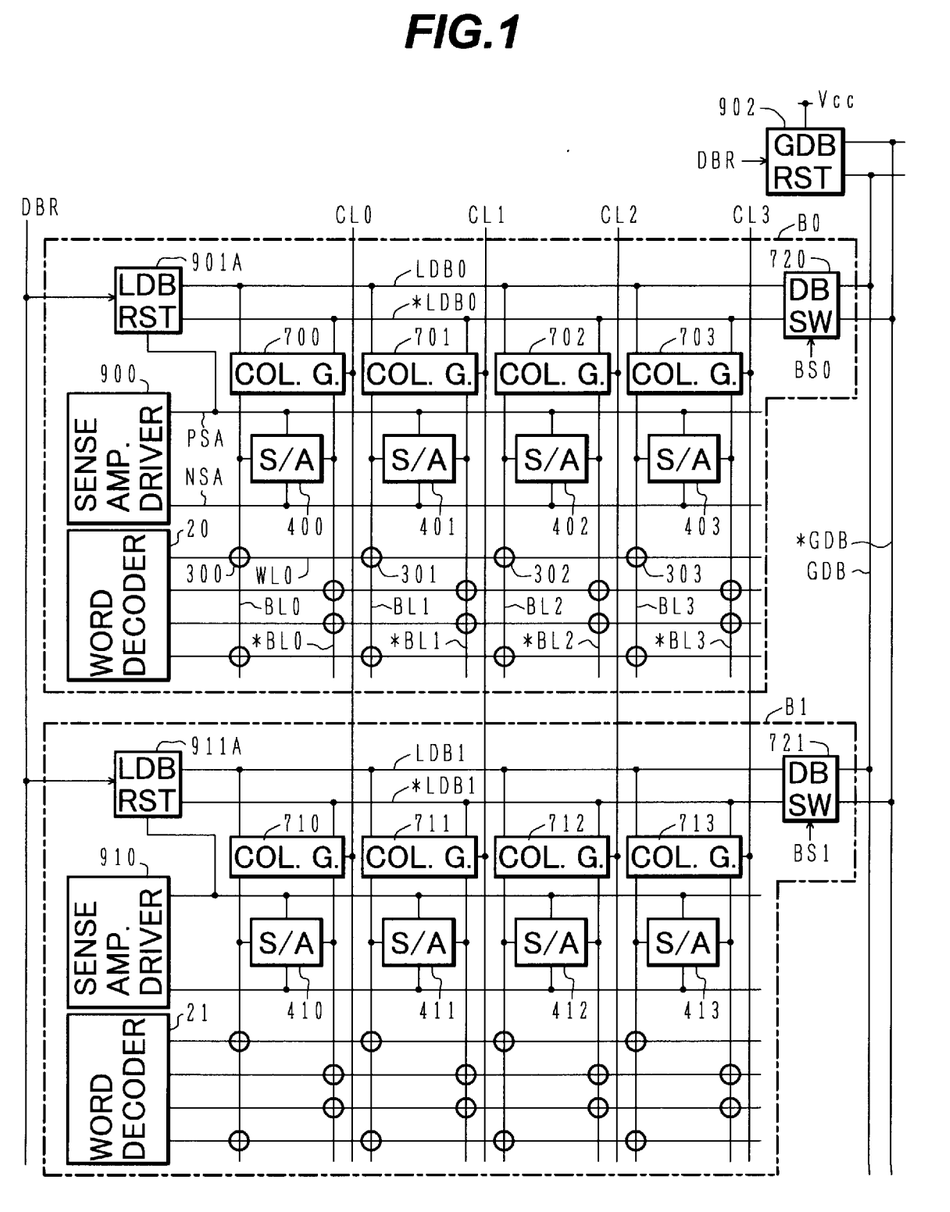
FIG. 1 is a block diagram showing a memory cell array and its peripheral circuit in a first embodiment according to the present invention.
Figure 2:
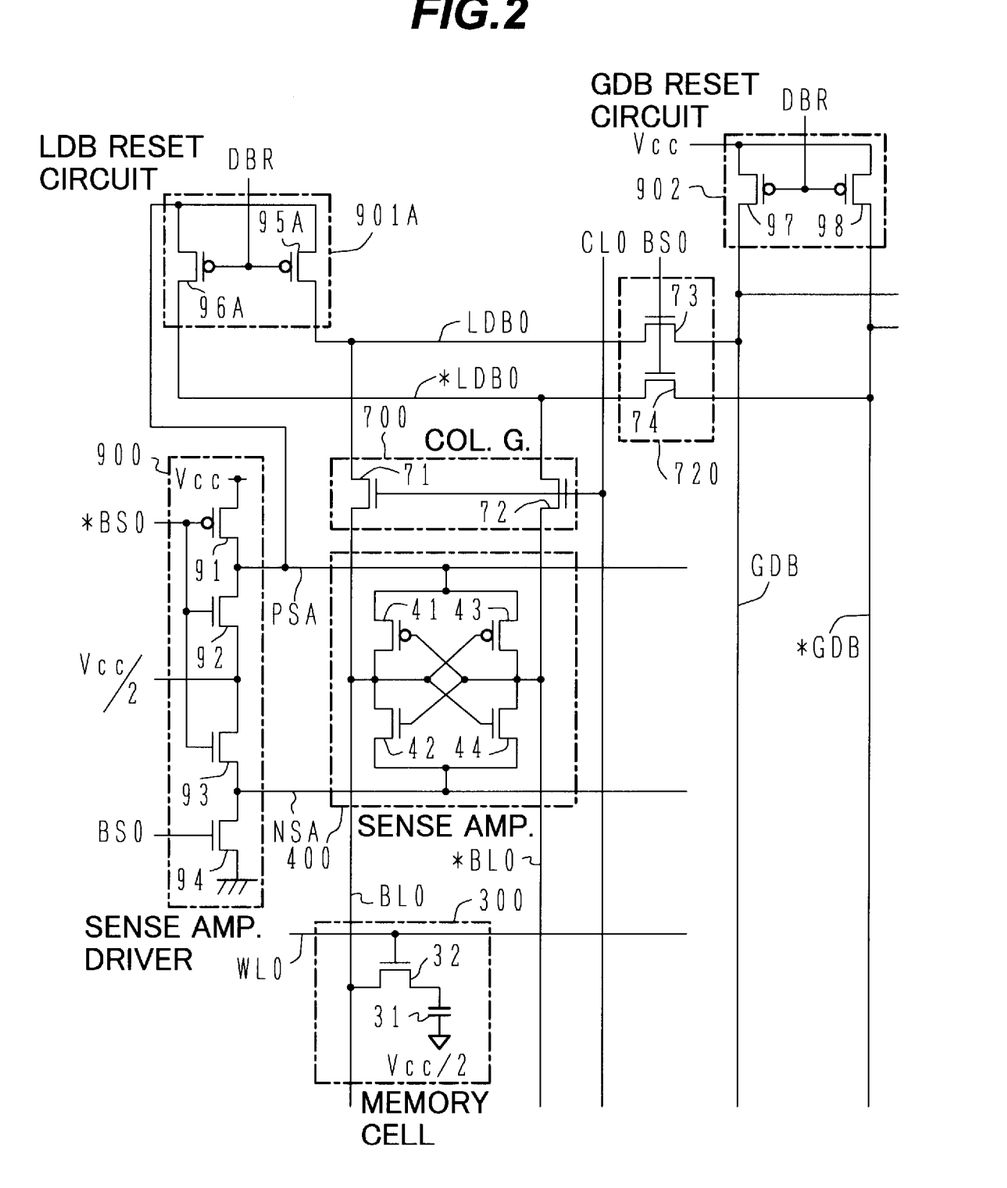
FIG. 2 is a circuit diagram showing a structural example of a portion of FIG. 1.

FIG. 1 is a block diagram showing a memory cell array and its peripheral circuit in a first embodiment according to the present invention and FIG. 2 is a circuit diagram showing a structural example of a portion of FIG. 1. FIGS. 1 and 2 respectively correspond to FIGS. 8 and 9.

In FIG. 2, a memory cell 300 includes a capacitor 31 and an nMOS transistor 32. The capacitor 31 is connected between one end of an nMOS transistor 32 and a conducting plate applied with an intermediate potential VCC/2. The other end of the NMOS transistor 32 and its gate electrode are connected to a bit line BL0 and a word line WL0 respectively.

In a sense amplifier 400, a CMOS inverter constituted by connecting in series a pMOS transistor 41 and an nMOS transistor 42 and a CMOS inverter constituted by connecting in series a pMOS transistor 43 and an nMOS transistor 44 are cross connected. Drains of the nMOS transistors 42 and 44 are respectively connected to the bit lines BL0 and *BL0.

In a sense amplifier driving circuit 900, a pMOS transistor 91 and NMOS transistors 92, 93 and 94 are connected in series between a wiring at a power-supply potential VCC and a wiring at a ground potential. The intermediate potential VCC/2 is supplied to a source of the NMOS transistor 92. The drain of the pMOS transistor 91 is connected to sources of the pMOS transistors 41 and 43 via a wiring PSA, and the drain of the nMOS transistor 94 is connected to sources of the nMOS transistors 42 and 44 via a wiring NSA.

The bit lines BL0 and *BL0 are respectively connected to local data bus lines LDB0 and *LDB0 via RMOS transistors 71 and 72 of a column gate 700. The local data bus lines LDB0 and *LDB0 are each connected at their one ends to one ends of pMOS transistors 95A and 96A of a LDB reset circuit 901A respectively, with other ends of the pMOS transistors 95A and 96A connected to the wiring PSA. Other ends of the local bus lines LDB0 and *LDB0 are respectively connected to global data bus lines GDB and *GDB via nMOS transistors 73 and 74 of a data bus switch 720. The global data bus lines GDB and *GDB are both connected at their one end to the wiring of the power-supply potential VCC via pMOS transistors 97 and 98 respectively.

A block selecting signal *BS0 is provided to the gate electrodes of the pMOS transistor 91 and the nMOS transistors 92 and 93, whereas a block selecting signal BS0 is provided to gate electrodes of the nMOS transistors 94, 73 and 74. A data bus reset signal DBR is provided to gate electrodes of the PMOS transistors 95A, 96A, 97 and 98.

In FIG. 1, data bus switches 720 and 721 are required because of the column selecting lines CL0 to CL3 being shared between the blocks B0 and B1.

The block B1 is structured identically to the block B0, with its LDB reset circuit 911A corresponding to the LDB reset circuit 901A, and the data bus reset signal DBR is provided to them commonly.

As is obvious by comparing FIG. 1 with FIG. 8 and FIG. 2 with FIG. 9, in this embodiment, the nMOS transistors 95 and 96 in the prior art are replaced by the PMOS transistors 95A and 96A with one end and the gate electrode of each of the pMOS transistors 95A and 96A connected to different connection destinations, and the increased component is only one wiring of the data bus reset signal DBR shown in FIG. 1, and its increased wiring area occupied on a semiconductor chip is insignificant.

Figure 3:
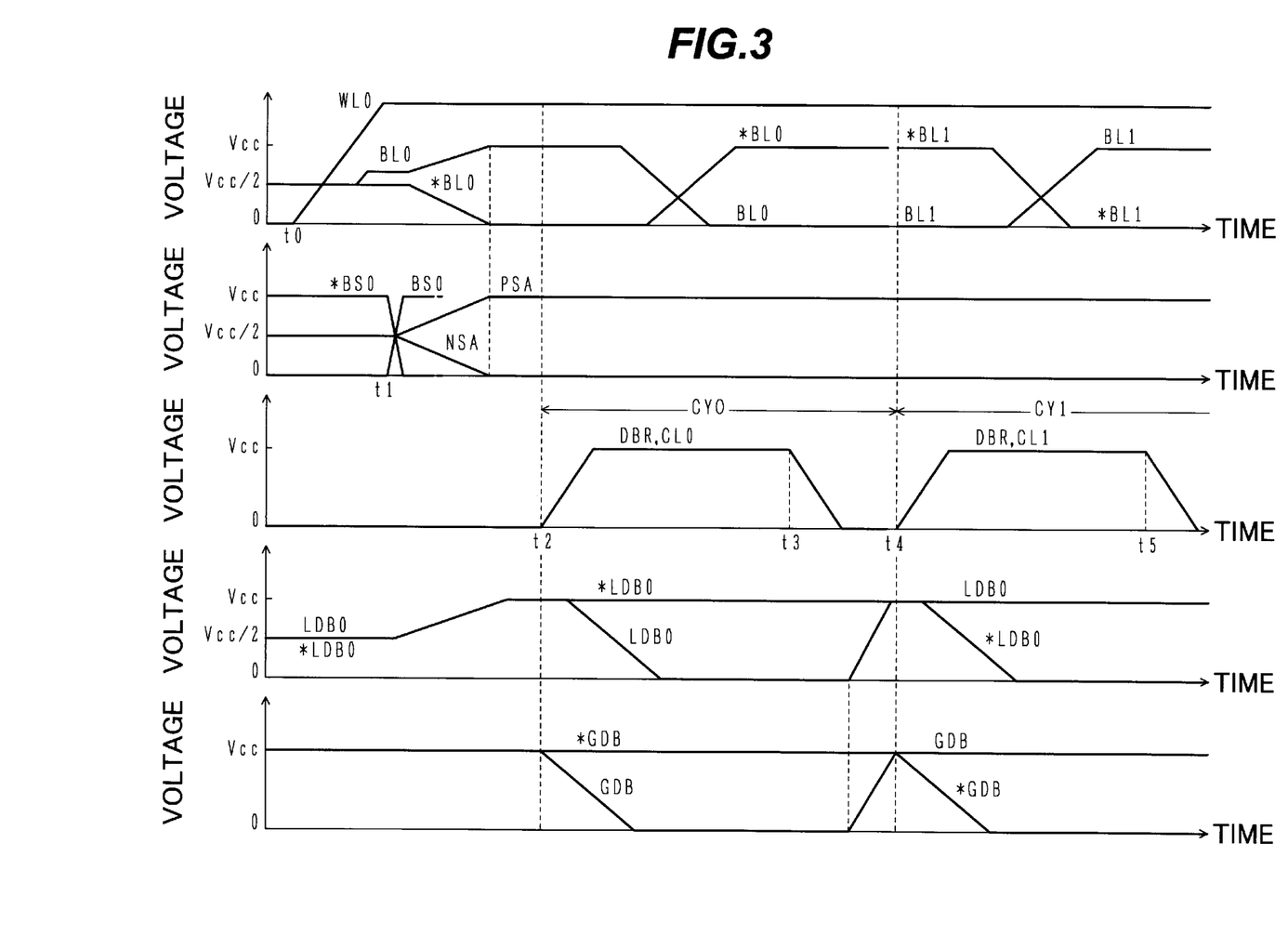
FIG. 3 is a waveform diagram showing an operation performed by the circuit shown in FIGS. 1 and 2.

Next, referring to FIG. 3, the operation of the DRAM structured as described above is described.

First, a standby state is described.

In FIG. 2, the block selecting signal BS0 is at a "L", thereby in the sense amplifier driving circuit 900, the pMOS transistor 91 and the nMOS transistor 94 are off, and the nMOS transistors 92 and 93 are on, and in the data bus switch 720, the nMOS transistors 73 and 74 are off. This sets the wirings PSA and NSA to the intermediate potential VCC/2, keeping the sense amplifier 400 in an inactive state.

Also, the data bus reset signal DBR is at a "L", thereby in the LDB reset circuit 901A, the pMOS transistors 95A and 96A are on and in the GDB reset circuit 902, the pMOS transistors 97 and 98 are on. This causes the local data bus line pair LDB0 and *LDB0 to be precharged to the intermediate potential VCC/2 and the global data bus line pair GDB and *GDB to be precharged to the power-supply potential VCC.

Furthermore, the column selecting line CL0 is at a "L", thereby the nMOS transistors 71 and 72 are off. The word line WL0 is at a "L", thereby the nMOS transistor 32 is off.

In FIG. 1, the column selecting lines CL1 to CL3, too, are at a "L" and the column gates that are connected to them are all closed. The block B1 is in the same state as the block B0.

Next, an explanation is given of the operation in which, when a "H" and a "L" are stored respectively in the memory cells 300 and 301, a "L" and a "H" data are sequentially written in the memory cells 300 and 301 respectively in burst mode.

Selection of the word line WL0 and the block B0 is performed in the following manner.

(t0) The word line WL0 is selected and its potential rises, thereby the data stored in the memory cells 300 to 303 in FIG. 1 are read out to the bit lines BL0 to BL3 respectively. This causes the potential on the bit line BL0 to rise slightly above the intermediate potential VCC/2 and the potential on the bit line BL1 to fall slightly below the intermediate potential VCC/2.

(t1) In FIG. 2, the block selecting signal BS0 transits to a "H", thereby in the sense amplifier driving circuit 900, the nMOS transistors 92 and 93 are turned off, the PMOS transistor 91 and the nMOS transistor 94 are turned on, and in the data bus switch 720, the nMOS transistors 73 and 74 are turned on.

This causes the wirings PSA and NSA to transit to a "H" and a "L" respectively to activate the sense amplifier 400, the pMOS transistor 41 and the nMOS transistor 44 are turned on and the nMOS transistor 42 and the pMOS transistor 43 are turned off. A positive charge flows from the wiring of the power-supply potential VCC through the PMOS transistor 91 and the PMOS transistor 41 to the bit line BL0, and a positive charge on the bit line *BL0 flows through the nMOS transistors 44 and 94 to be discharged to the grounding line. As a result, the difference between the potentials in the bit lines BL0 and *BL0 is amplified, making the bit lines BL0 and *BL0 transit to a "H" and a "L" respectively. In a like manner, the bit lines BL1 to BL3 and *BL1 to *BL3 in FIG. 1 changes according to the storage data in memory cells 301 to 303.

In addition, a positive charge flows from the wiring of the power-supply potential VCC through the pMOS transistor 91 and the pMOS transistors 95A and 96A to the local data bus lines LDB0 and *LDB0 to precharge LDB0 and *LDB0 to the power-supply potential VCC.

The change described above does not take place in the block B1 because the block selecting signal BS1 keep a "L".

The operation for writing a "L" into the memory cell 300 where "H" is stored is performed in the following manner.

(t2) In FIG. 2, the data bus reset signal DBR and the column selecting line CL0 transit to a "H", thereby the pMOS transistors 95A and 96A of the LDB reset circuit 901A and the pMOS transistors 97 and 98 of the GDB reset circuit 902 are turned off and the nMOS transistors 71 and 72 of the column gate 700 are turned on. Coincident with this, write data is provided from the data I/O buffer circuit (see FIG. 7) to transit the global data bus line GDB to a "L" and this is transmitted to the local data bus line LDB0 and the bit line BL0.

In the sense amplifier 400, the pMOS transistor 43 and the nMOS transistor 42 are turned on and the nMOS transistor 44 and the pMOS transistor 41 are turned off, reversing the state of the sense amplifier 400.

In FIG. 1, the column gate 710 of the unselected block B1 opens when the column selecting line CL0 is set to a "H" after the time t2. If the local data bus line pair LDB0 and *LDB0 were precharged to the power-supply potential VCC prior to the time t1, a current would flow from the local data bus lines LDB1 and *LDB1 at the potential VCC through the column gate 710 to the bit line pair at the intermediate potential VCC/2 connected to the sense amplifier 410.

"L" in the bit line BL0 transmits through the nMOS transistor 32 to be written in the capacitor 31.

In FIG. 1, since the column gates 701 to 703 are closed, data on the bit lines that have been amplified by the sense amplifiers 401 to 403 are rewritten in the memory cells 301 to 303.

(t3) As a preparation to a next access, in FIG. 2, the data bus reset signal DBR and the column selecting line CL0 transit to "L", thereby the pMOS transistors 95A, 96A, 97 and 98 are turned on and the nMOS transistors 71 and 72 are turned off.

On the one hand, this causes the global data bus line pair GDB and *GDB to be precharged to the power-supply potential VCC from the wiring of the power-supply potential VCC through the pMOS transistors 97 and 98, and on the other hand, it causes the local data bus line pair LDB0 and *LDB0 to be precharged to the power-supply potential VCC from the wiring of the power-supply potential VCC through the PMOS transistor 91 and the pMOS transistors 95A and 96A. These precharges are performed in order to prepare for the next access, which may be a readout.

In this embodiment, since the global data bus line pair GDB and *GDB are precharged to the power-supply potential VCC by the GDB reset circuit 902 and, coincident with this, the local data bus line pair LDB0 and *LDB0 are precharged to the power-supply potential VCC by the LDB reset circuit 901A, the global data bus line GDB and the local data bus line LDB0 rise faster than they do in the prior art, resulting in a reduction in the length of time elapsing from the time t3 to t4 compared to the prior art. To be more specific, the length of time t3 to t4 is approximately 4 ns in the prior art, whereas it is reduced to approximately 2 ns here, with the write cycle CY1 reduced by approximately 25% from approximately 6 ns to approximately 4 ns. The only component that must be added to achieve this advantage is one wiring for the data bus reset signal DBR in FIG. 1 as described above, achieving an advantage that far outweighs the increase in the number of components required.

The operation for writing "H" in the memory cell 301 where "L" is stored is performed in the following manner.

(t4) In FIG. 1, the data bus reset signal DBR and the column selecting line CL1 transit to a "H", the LDB reset circuit 901A and the GDB reset circuit 902 are turned off and the column gate 701 is turned on. Coincident with this, write data is provided from the data I/O buffer circuit, making the global data bus line *GDB transit to a "L" and this is transmitted to the local data bus line *LDB0 and the bit line *BL1. In addition, "H" at the local data bus line LDB0 is transmitted to the bit line BL1.

This makes the bit lines BL1 and *BL1 transit to a "H" and a "L" respectively and a "H" on the bit line BL1 is written in the memory cell 301.

Since the column gates 700, 702 and 703 are closed, the data that have been amplified by the sense amplifiers 400, 402 and 403 are rewritten in the memory cells 300, 302 and 303 respectively.

(t5) The data bus reset signal DBR and the column selecting line CL1 transit to a "L", thereby the reset circuits 901A and 902 are turned on and the column gate 701 is turned off. This causes the global data bus line pair GDB and *GDB and the local data bus line pair LDB0 and *LDB0 to be precharged to the power-supply potential VCC.

The write cycle CY1 with which a write to the memory cell 301 is performed is the same as a write cycle CY0 with which a write to the memory cell 300 is performed. Writes into the memory cells 302 and 303 are sequentially performed in like manner as that described above.

Second Embodiment

Although a case in which data buses are precharged to the power-supply potential VCC has been described in the first embodiment, the present invention may adopt a structure in which they are precharged to a reference potential. An example of this structure is next described as the second embodiment.

Figure 4:
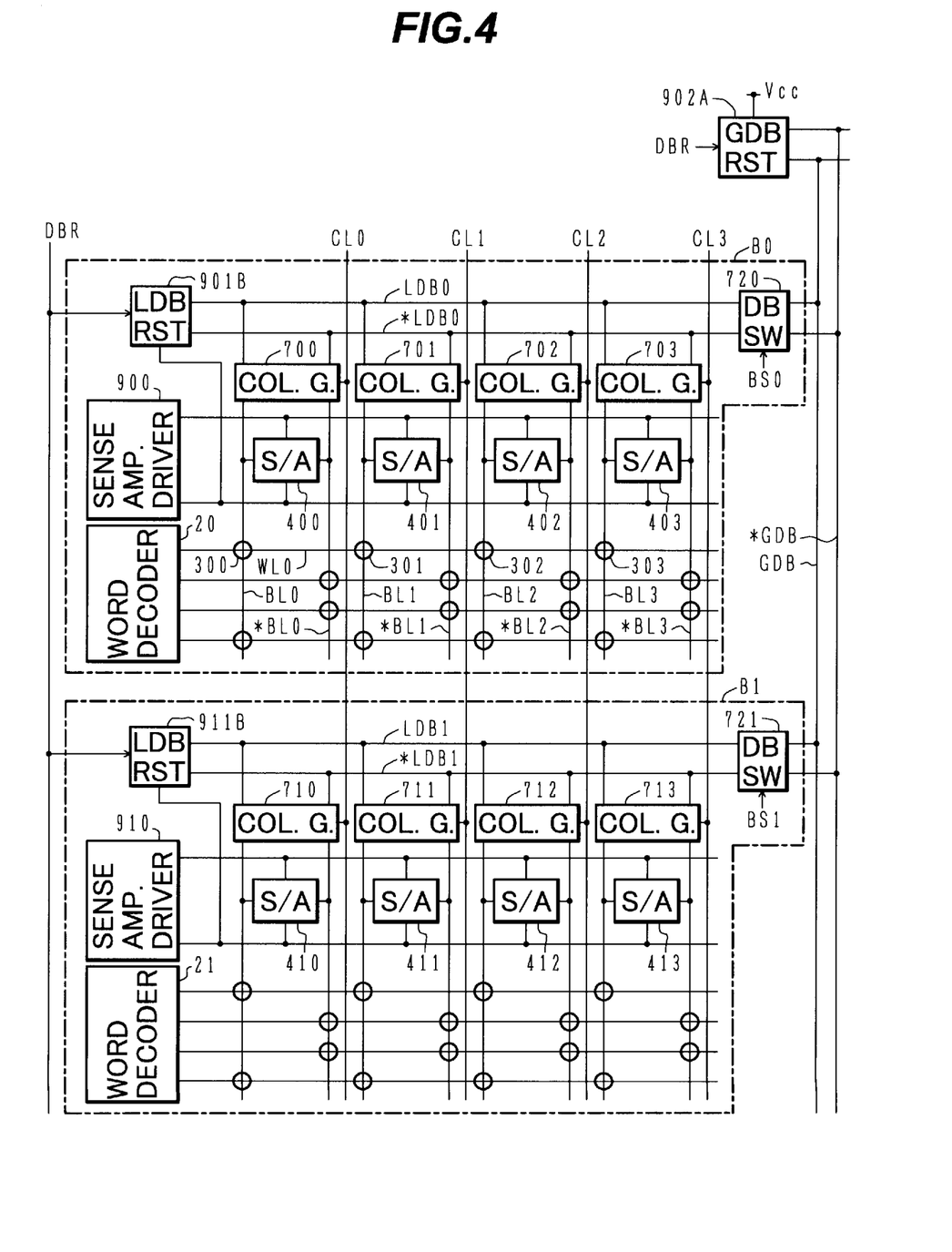
FIG. 4 is a block diagram showing a memory cell array and its peripheral circuit in a second embodiment according to the present invention.
Figure 5:
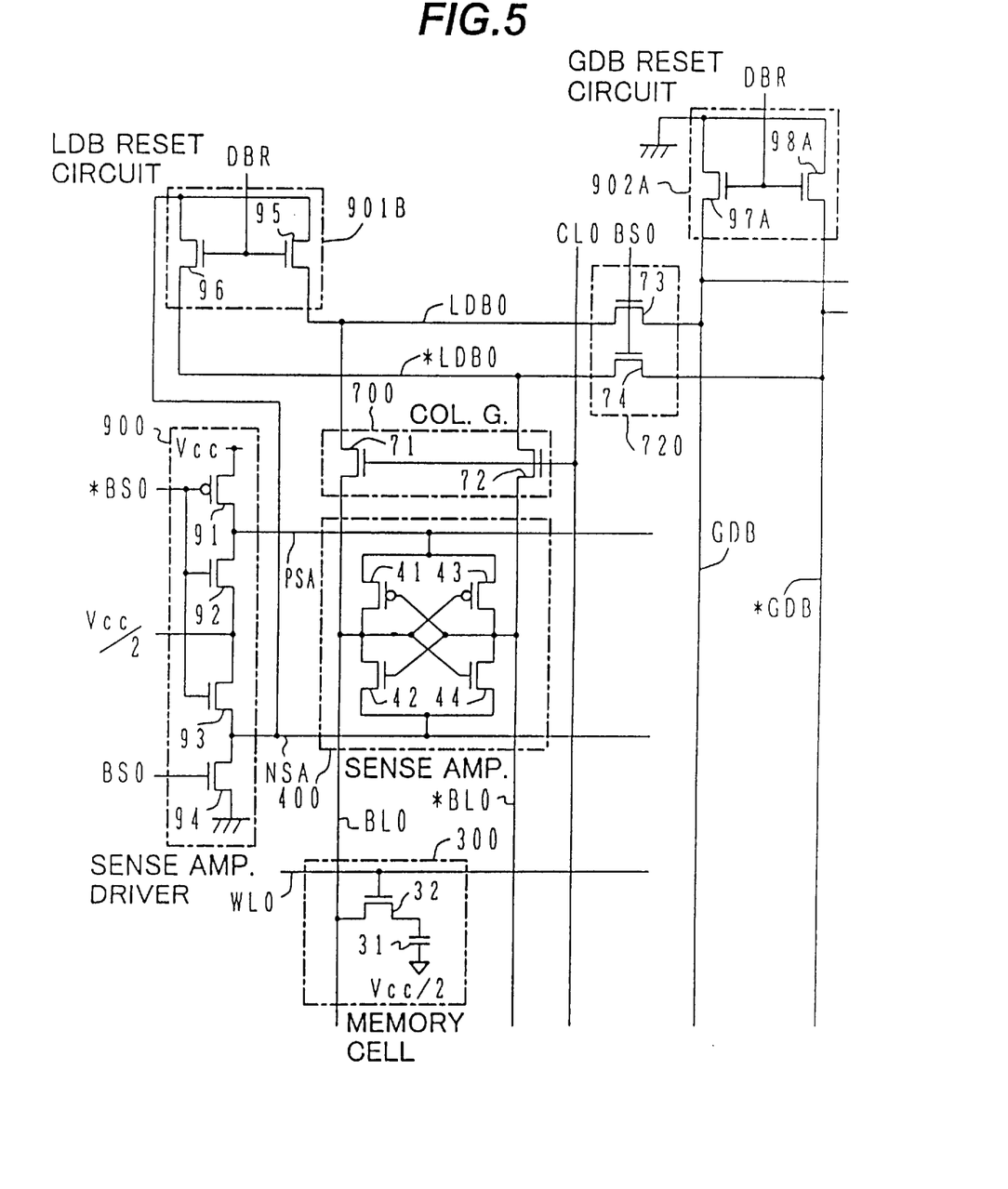
FIG. 5 is a circuit diagram showing a structural example of a portion of FIG. 4.

FIG. 4 is a block diagram showing the memory cell array and its peripheral circuit, and FIG. 5 is a circuit diagram showing a structural example of a portion of FIG. 4. FIGS. 4 and 5 correspond to FIGS. 1 and 2 respectively.

In FIG. 5, in a LDB reset circuit 901B, nMOS transistors 95 and 96 are connected at their one ends to the drain of the nMOS transistor 94 and their other ends are connected to one ends of the local data bus lines LDB0 and *LDB0 respectively. In a GDB reset circuit 902A, nMOS transistors 97A and 98A are connected at their one ends to a grounding line and their other ends are connected to the global data bus lines GDB and *GDB respectively.

Other structure are identical to those in the first embodiment.

Figure 6:
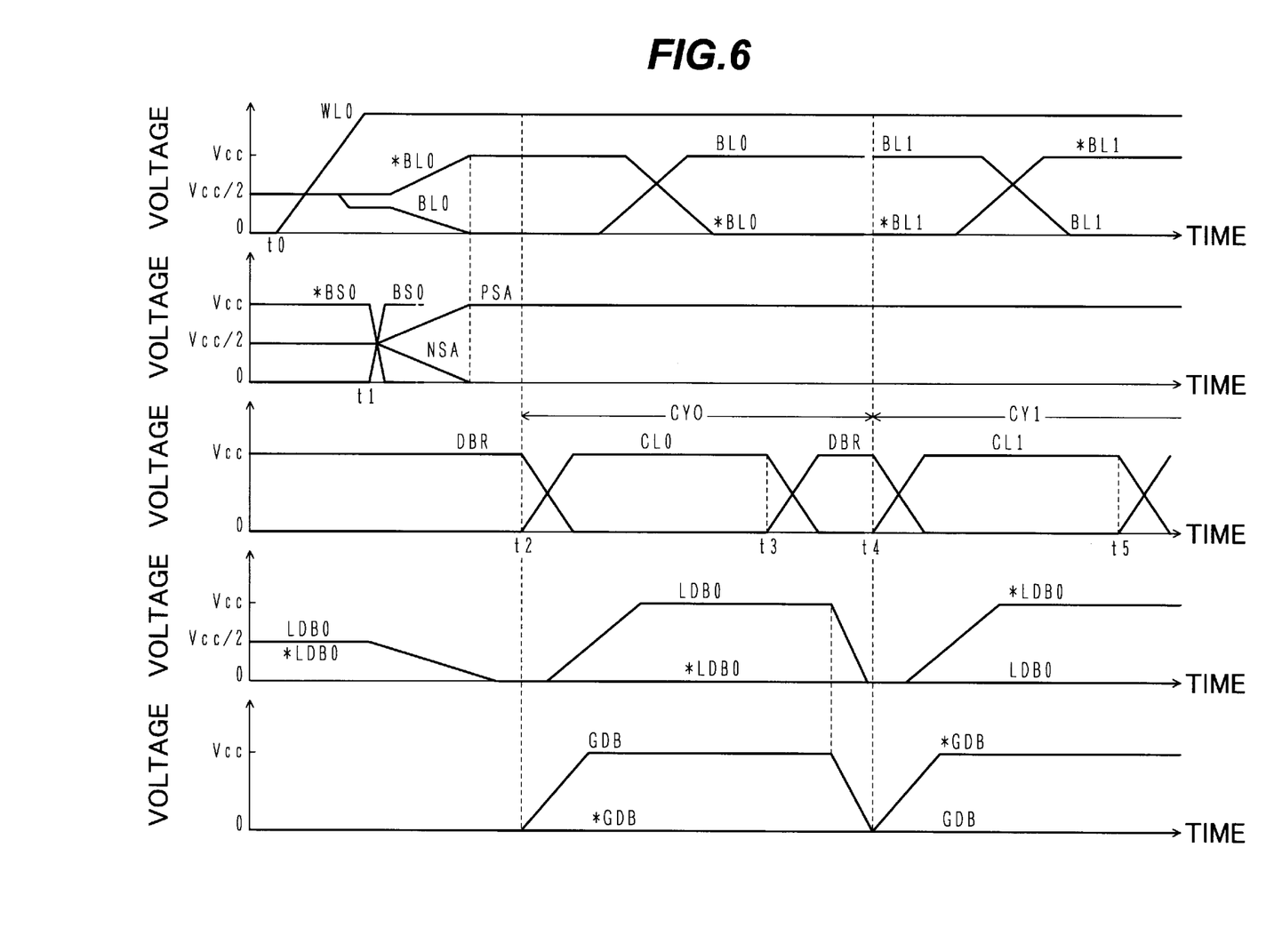
FIG. 6 is a waveform diagram showing an operation performed by the circuit shown in FIGS. 4 and 5.

FIG. 6 is a waveform diagram showing an operation performed by the circuit shown in FIGS. 4 and 5 and corresponds to FIG. 3. However, FIG. 6 illustrates an operation in which the data for a "H" and a "L" are sequentially written in the memory cells 300 and 301 in FIG. 4 respectively when a "L" and a "H" are stored in the memory cells 300 and 301 respectively. "H" and "L" of the data bus reset signal DBR are reversed from those in FIG. 3.

In this embodiment, between the times t3 and t4, the global data bus line pair GDB and *GDB are precharged to 0V by the GDB reset circuit 902A and, coincident with this, the local data bus line pair LDB0 and *LDB0 are precharged to 0V by the LDB reset circuit 901B. Consequently, the global data bus line GDB and the local data bus line LDB0 fall faster to 0 V than in the prior art and the length of time from t3 to t4 is reduced compared to the prior art, achieving an advantage that far outweighs the increase in the number of components required.

Although preferred embodiment of the present invention has been described, it is to be understood that the invention is not limited thereto and that various changes and modifications may be made without departing from the spirit and scope of the invention.

For instance in FIG. 2, since no problem arises by slightly varying the timing between the data bus reset signal DBR provided to the LDB reset circuit 901A and the data bus reset signal DBR provided to the GDB reset circuit 902A, these two data bus reset signal may be different to each other. The pMOS transistors 95A ,96A, 97 and 98 may be connected with nMOS transistors respectively in parallel to constitute transfer gates. The sense amplifier 400 and the sense amplifier driving circuit 900, too, may adopt any of different structures as long as they provide similar function. The same variations described above in reference to FIG. 2 are also possible as variations of the structure shown in FIG. 5.

A structure without the GDB reset circuit 902 or 902A may also be adopted, and in that case, an advantage will be achieved in that the structure will be simplified with the number of circuit elements reduced.

Although the explanation has been given so far of a case in which the DRAM is constituted of a plurality of blocks in the embodiments above, the present invention may be adopted in a single block structure. The memory cells in the DRAM may be any of a variety of types and is not limited to the charge holding type. For instance, they may be of the current type provided with pseudo floating gates whereby the current values are different between "H" and "L" stored states with the transfer gate open. In addition, the present invention may also be adopted in an SRAM.

Moreover, the present invention includes a semiconductor device such as an MPU or a DSP with an internal RAM.

What is claimed is:

1. A semiconductor device including a random-access memory, said random-access memory comprising:

a sense amplifier driving circuit, for providing an intermediate potential to a first wiring and a second wiring in response to a selecting signal being inactive, and for providing a first potential higher than said intermediate potential via a first switching element to said first wiring and a second potential lower than said intermediate potential via a second switching element to said second wiring in response to a selecting signal being active;

a sense amplifier, powered by a voltage between said first wiring and said second wiring, for amplifying a voltages between a bit line pair;

a column gate, having a switching element connected between said bit line pair and a first data bus line pair, to be selectively opened/closed corresponding to a given memory address; and a first bus reset circuit, connected between one of said first wiring or said second wiring and said first data bus line pair, having a switching element to be closed/opened in correspondence to an opened/closed state of said column gate.

2. A semiconductor device according to claim 1, wherein said random-access memory comprises a plurality of blocks each including said sense amplifier driving circuit, said sense amplifier, said column gate and said first bus reset circuit, and wherein said selecting signal is applied to selecting one of said plurality of blocks, said random-access memory further comprises:

a data bus switching circuit, connected between a second data bus line pair provided outside said plurality of blocks and said first data bus line pair within each of said plurality of blocks, to be opened/closed in correspondence to said selecting signal being active/inactive.

3. A semiconductor device according to claim 2, further comprising:

a second bus reset circuit connected between a conductor and said second data bus line pair, having a switching element to be closed/opened in correspondence to said open/closed state of said column gate, said conductor being supplied with either said first potential or said second potential corresponding to said one of said first wiring and said second wiring.

4. A semiconductor device according to claim 3, wherein both of a control input of said switching element of said first bus reset circuit and a control input of said switching element of said second bus reset circuit receive a common control signal.

5. A semiconductor device according to claim 4, wherein said first bus reset circuit comprises:

a first pMOS transistor, connected between said first wiring and one of said first data bus line pair, having a gate electrode adapted to receive a data bus reset signal; and a second pMOS transistor, connected between said first wiring and the other of said first data bus line pair, having a gate electrode connected to said gate electrode of said first pMOS transistor;

wherein said second bus reset circuit comprises:

a third pMOS transistor, connected between said conductor supplied with said first potential and one of said second data bus line pair, having a gate electrode adapted to receive said data bus reset signal;

a fourth pMOS transistor, connected between said conductor and the other of said second data bus line pair, having a gate electrode connected to said gate electrode of said third pMOS transistor.

6. A semiconductor device according to claim 4, wherein said first bus reset circuit comprises:

a first nMOS transistor, connected between said second wiring and one of said first data bus line pair, having a gate electrode adapted to receive a data bus reset signal; and a second NMOS transistor, connected between said second wiring and the other of said first data bus line pair, having a gate electrode connected to said gate electrode of said first nMOS transistor;

wherein said second bus reset circuit comprises:

a third nMOS transistor, connected between said conductor supplied with said second potential and one of said second data bus line pair, having a gate electrode adapted to receive said data bus reset signal;

a fourth nMOS transistor, connected between said conductor and the other of said second data bus line pair, having a gate electrode connected to said gate electrode of said third NMOS transistor.

7. A semiconductor device according to claims 1, wherein said random-access memory is a DRAM.

8. A semiconductor device according to claim 7, wherein said DRAM comprises:

a transfer gate, having one end connected to one of said bit line pair, having another end, and having a control input for controlling a current between their ends, said control input connected to a word line; and a capacitor, connected between said another end of said transfer gate and a conductor supplied with a potential.

9. A random-access memory comprising:

a sense amplifier driving circuit having an output node, for providing a first potential or a second potential being different from said first potential at said output node in response to a selecting signal;

a bus line operatively connected with a bit line, for transmitting data from said bit line; and a bus reset circuit, connected between said output node and said bus line, for providing said first potential or said second potential in a reset period.

* * * * *